United States Patent
Menon et al.

(10) Patent No.: US 7,148,496 B2
(45) Date of Patent: Dec. 12, 2006

(54) SYSTEM AND METHOD FOR PROXIMITY EFFECT CORRECTION IN IMAGING SYSTEMS

(75) Inventors: Rajesh Menon, Cambridge, MA (US); Dario Gil, Pleasantville, NY (US); George Barbastathis, Boston, MA (US); Henry I. Smith, Sudbury, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/823,458

(22) Filed: Apr. 13, 2004

(65) Prior Publication Data

US 2005/0224725 A1   Oct. 13, 2005

(51) Int. Cl.
*H01J 37/304* (2006.01)
(52) U.S. Cl. ............... 250/492.22; 250/492.2; 364/468; 364/28; 430/26
(58) Field of Classification Search ............... None
See application file for complete search history.

(56) References Cited

U.S. PATENT DOCUMENTS

| | | | |
|---|---|---|---|
| 5,051,598 A * | 9/1991 | Ashton et al. | 250/492.2 |
| 5,847,959 A * | 12/1998 | Veneklasen et al. | 700/121 |
| 6,081,659 A | 6/2000 | Garza et al. | |
| 6,376,132 B1 | 4/2002 | Yamashita | |
| 6,920,368 B1 * | 7/2005 | Van Dyck et al. | 700/121 |

FOREIGN PATENT DOCUMENTS

| | | |
|---|---|---|
| EP | 1329771 A2 | 7/2003 |
| WO | WO 01/76872 | 10/2001 |

* cited by examiner

*Primary Examiner*—Jack Berman
*Assistant Examiner*—Zia R. Hashmi
(74) *Attorney, Agent, or Firm*—Gauthier & Connors LLP (57) ABSTRACT

A system and method are disclosed for providing error correction in an imaging system. The system includes an error determination unit for determining an amount of error associated with a spot at (x,y) in a binary pattern to be imaged, a determination unit for determining the location of a nearest exposed spot at $(x_i, y_i)$ for each spot at (x,y), and a dose modification unit for modifying an exposure dose at the nearest exposed spot at $(x_i, y_i)$ for each spot at (x,y).

20 Claims, 6 Drawing Sheets

SYSTEM AND METHOD FOR PROXIMITY EFFECT CORRECTION IN IMAGING SYSTEMS

This invention was made with support from the United States government under Grant No. DAAD19-01-1-0330, and the United States government has certain rights to the invention.

BACKGROUND

The invention relates to lithography systems, and relates in particular to direct-write lithography such as scanning-electron-beam lithography or scanning-optical-beam lithography.

In many lithography systems, the close proximity of certain types of features may cause pattern deformation in the resulting image. For example, in a scanning-spot-lithography system, a focused spot (of either electrons or photons) is scanned relative to a substrate to write the desired pattern. The latent-image is recorded in a chemical layer known as resist. In the case of a positive-tone resist, the area that is exposed is removed upon development, leaving the written pattern as topography in resist. In the case of negative-tone resist, the exposed areas remain after development, whereas all other areas are removed.

Figure 1A:
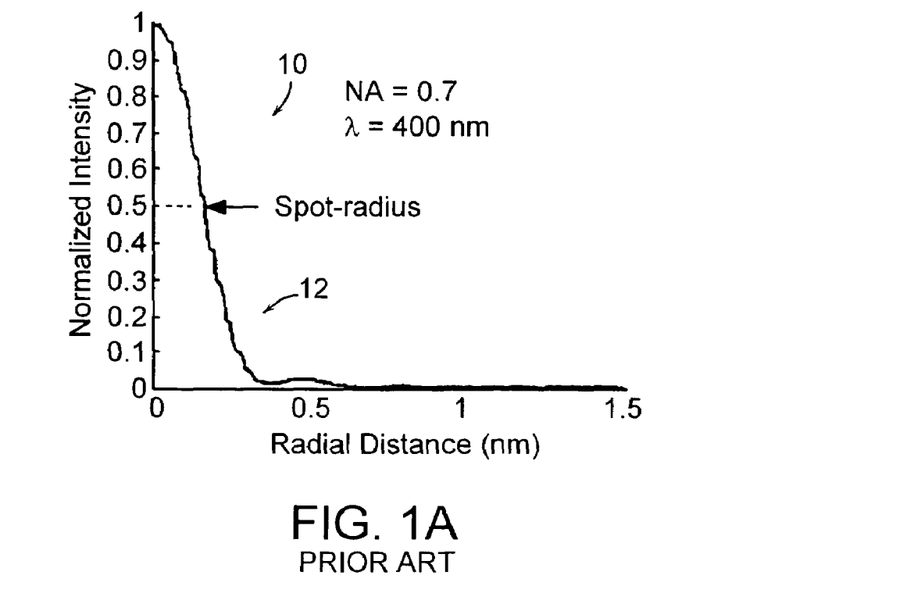
FIGS. 1A and 1B show illustrative graphical representations of conventional background noise from a focused spot in linear scale and in log-scale, respectively.
Figure 1B:
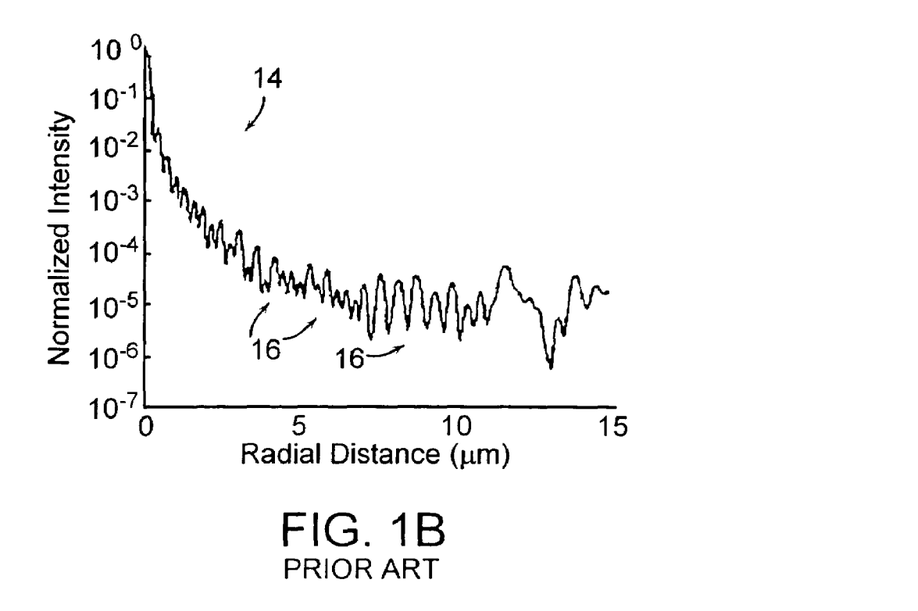

Although the intensity profile of the focused spot falls rapidly with distance from the center, the distribution extends over a large distance as shown at 10 in FIG. 1A. In particular, FIG. 1A shows a cross-section through the center of a simulated focal spot of a 0.7 numerical-aperture zone plate operating at $\lambda$=400 nm. The radius is measured at the half-maximum point. The intensity 12 that is outside the desired size of the spot acts as background, contributing exposure dose to neighboring regions. This background noise may adversely affect intensity imaging as well as thermal (or threshold) imaging. The image of the final exposed pattern includes exposed spots from other regions in the pattern. The addition of exposure dose in the unintended regions of the pattern is therefore a cumulative process. The intensity of a single focused spot may be plotted in log-scale as shown at 14 in FIG. 1B. The tail end 16 of the intensity plot acts as background to the desired dose, and delivers exposure dose to the neighboring regions in the resist. When the spots are numerous and close together (i.e., with dense features in the pattern), the cumulative dose tends to distort the exposed pattern. This creates unwanted proximity effects.

Figure 2A:
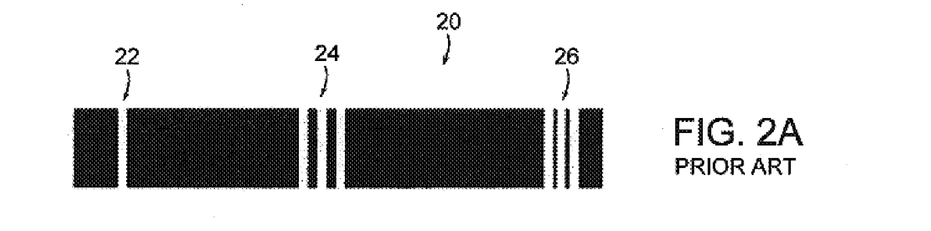
FIGS. 2A–2D show illustrative graphical representations of proximity effects in a system of the prior art showing a desired binary pattern, an exposed pattern, an intensity profile, and a developed image, respectively.
Figure 2B:
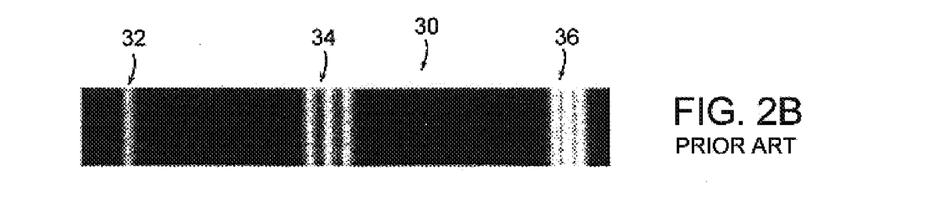
Figure 2C:
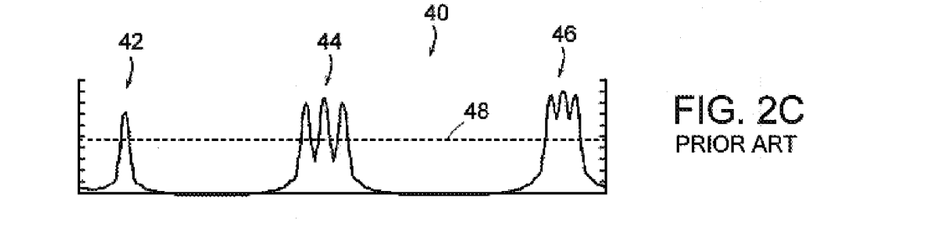
Figure 2D:
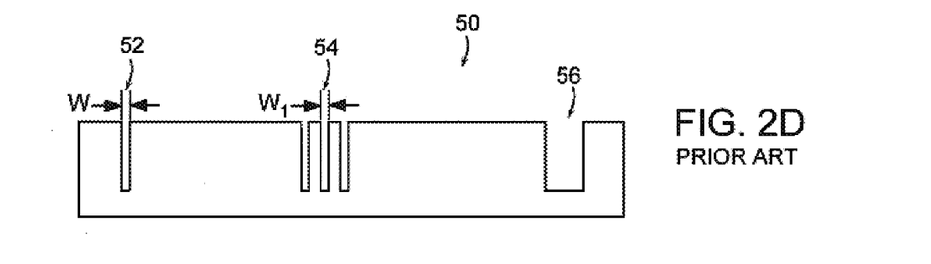

As shown, for example in FIG. 2A, a binary pattern 20 that consists of an isolated line 22, a first group of three lines 24 and a second group of three tightly spaced lines 26 may be imaged. The desired linewidth is the same for all the sets of lines. FIG. 2B shows the simulated image of the exposed pattern 30 including a pattern 32 for the isolated line 22, an image 34 for the first group of lines 24 and an image 36 for the second group of lines 26. The cross-section through the intensity profile of the image 40 is shown in FIG. 2C where the profile 42 is associated with the isolated line 22, profile 44 is associated with the first group of lines 24 and profile 46 is associated with the second group of lines 26. The response of resist to an image is approximated by a thresholding function, i.e., areas of the resist that receive a total-exposure dose more than a certain resist-threshold 48 are completely removed after development. Assuming this model, the resist profile after development is shown in FIG. 2D where it may be seen that the width of the isolated line 52, W is smaller than each of the widths of the semi-dense lines 54, $W_1$. As seen from the intensity profile, this is due to the fact that the close proximity of the lines causes exposure dose to spill over into the spaces between the lines, and hence increase the linewidths. This phenomenon is so severe in the case of lines of high density 26 that these lines are completely washed out after development and not resolved at all, as shown at 56. This shows that proximity effects not only modify the intended linewidths of features but also affect the resolution of the lithography system.

There is a need therefore, for a proximity-effect-correction technique that efficiently and effectively provides improved imaging with high contrast and high-resolution.

SUMMARY OF THE INVENTION

The invention provides a system and method for providing error correction in an imaging system. The system includes an error determination unit for determining an amount of error associated with a spot at (x,y) in a binary pattern to be imaged, a determination unit for determining the location of the nearest exposed spot $(x_i, y_i)$ for each spot (x,y), and a dose modification unit for modifying an exposure dose at the nearest exposed spot $(x_i, y_i)$ for each spot (x,y).

In accordance with another embodiment, the error determination unit determines a convolution of a binary pattern to be imaged with a point spread function. In further embodiments, the error determination unit determines an inverse fast-Fourier transform of a product of a fast-Fourier transform of a binary pattern and a fast-Fourier transform of a point spread function.

BRIEF DESCRIPTION OF THE DRAWINGS

The following description may be further understood with reference to the accompanying drawings in which.

The drawings are shown for illustrative purposes and are not to scale.

DETAILED DESCRIPTION OF THE ILLUSTRATED EMBODIMENTS

In accordance with various embodiments of the invention, a system and method are proposed that may efficiently correct for proximity effects in direct-write nanolithography. The proximity-effect correction (PEC) is achieved by controlling the exposure dose at, and location of each written pixel. The optimum exposure dose at each pixel is calculated based on this algorithm. The proximity-effect-correction techniques may be implemented in a zone-plate-array-lithography system based on the independent modulation of the intensity of each beam.

Figure 3A:
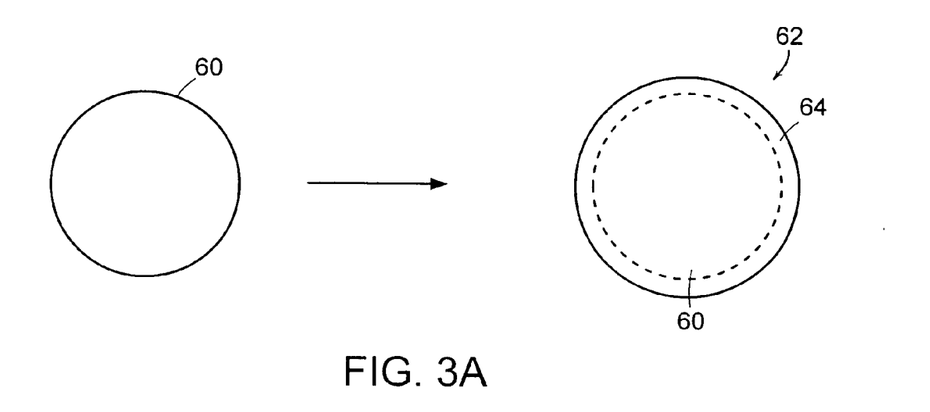
FIGS. 3A and 3B show illustrative diagrammatic views of dose sizes and image sizes for un-modulated and modulated doses respectively in accordance with an embodiment of the invention.
Figure 3B:
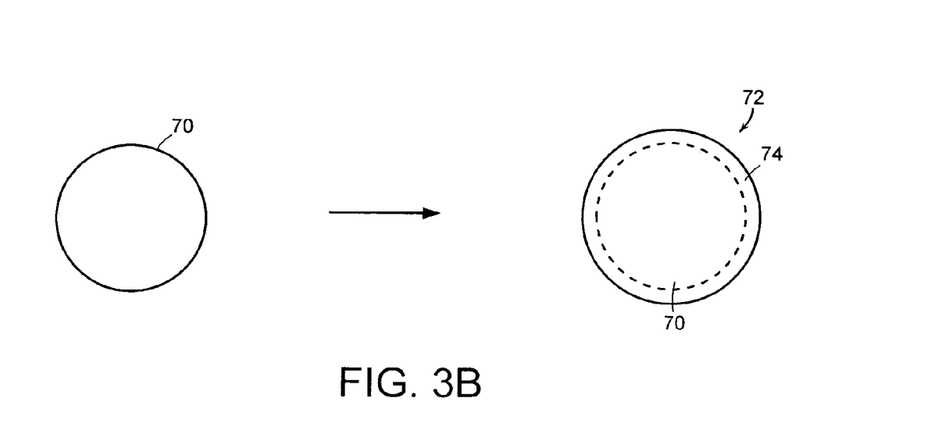

In a scanning-spot-lithography system, the exposure dose at each spot may be controlled by changing the exposure time (grayscaling). This dose modulation may be used to correct for proximity effects. The technique is illustrated in FIGS. 3A and 3B using a simple example. In FIG. 3A, a single spot 60 is exposed in resist is shown at 62. Due to the exposure of other spots nearby (not shown), background dose gets added to the original dose 60, thereby making a contribution 64 to the resulting spot diameter. This causes the size of the spot to increase, as shown. The solution to this problem is to underexpose the spot 70 in the first place such that the new dose 70, together with the background contribution 74 produce a spot 72 of the desired size, as shown in FIG. 3B. The correct spot-size, therefore, may be regained by appropriately underexposing the spot such that the lower dose together with the background produce the correct (nominal) dose. In addition to the dose, the position of each exposed spot may also be controlled to optimize the patterns i.e., the pattern may be composed of spots spaced at a distance less than an individual spot-size (known as sub-pixel stepping). Effective PEC using these two techniques requires calculation of the exposure doses prior to actual exposure. A procedure that may be used to perform this calculation in an efficient and accurate manner is described below.

The iterative-error-correction method involves modifying the exposed pattern in a step-by-step manner by modulating only those exposure doses that are responsible for causing deviation from the desired pattern. This modulation is performed in an iterative manner. The steps involved are as follows with reference to FIG. 4.

Figure 4:
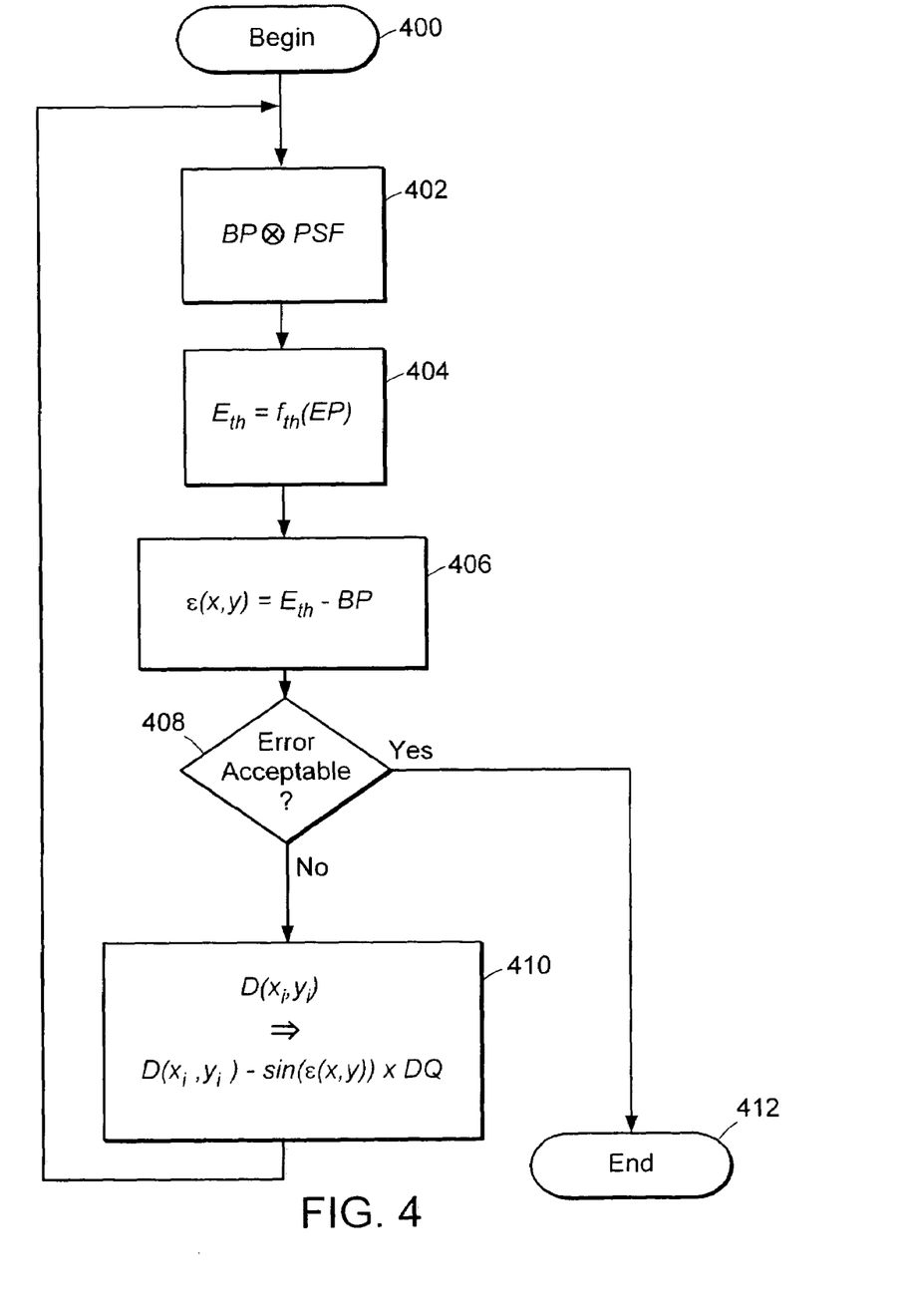
FIG. 4 shows an illustrative flowchart of the processing steps that may be used in a system in accordance with an embodiment of the invention.

The process begins (step 400) with an initial binary pattern in which all doses inside the pattern equal 1 and 0 everywhere else. The exposed pattern is simulated as a discrete convolution of the binary pattern, and the intensity-distribution of the focused spot. In particular, the binary pattern (BP) is convolved with the point-spread-function (PSF) of the imaging system (step 402). This convolution is discrete because the binary pattern is formed on a discrete exposure grid. In practice, the convolution is performed by taking the fast-Fourier-transform (FFT) of the design pattern (which is already discretized on the exposure grid) and taking the FFT of the PSF, and multiplying the two together. The inverse FFT of the result gives the simulated aerial image. The convolution and deconvolution may be performed using other fast algorithms as well.

The exposed pattern (EP) is then passed through a thresholding function $f_{th}$ that determines the reaction of the resist on the projected image (step 404). Those regions of the image that have intensity higher than a given threshold are set to 1, and all other regions are set to 0. Other resist-development models may be applied at this step as well.

The difference between the thresholded pattern, $E_{th}$ and the original-binary pattern, BP is determined as $\epsilon$ (step 406).

$$\epsilon(x,y) = E_{th} - BP$$

For each point (x,y) that has non-zero unacceptable error (step 408), a search is performed to determine the location of its nearest-exposed spot, $(x_i, y_i)$. Depending on the sign of the error at (x,y), the dose at $(x_i, y_i)$ is modified by a dose quantum (step 410). The dose quantum is determined by the resolution of dose-control available in the system.

$$D(x_i, y_i) \rightarrow D(x_i, y_i) - \text{sign}(\epsilon(x,y)) \times DQ$$

where DQ is the dose quantum and sign is the sign-function. In further embodiments, nearest neighbors as well as next-nearest neighbors and those even further away may be considered in a similar fashion if desired.

Lastly, using the dose-modulated pattern, $D(x_i, y_i)$, the exposed pattern is again calculated. Steps 402 through 410 are repeated until an acceptable level of error is achieved (step 408) and the process ends (step 412).

Figure 5:
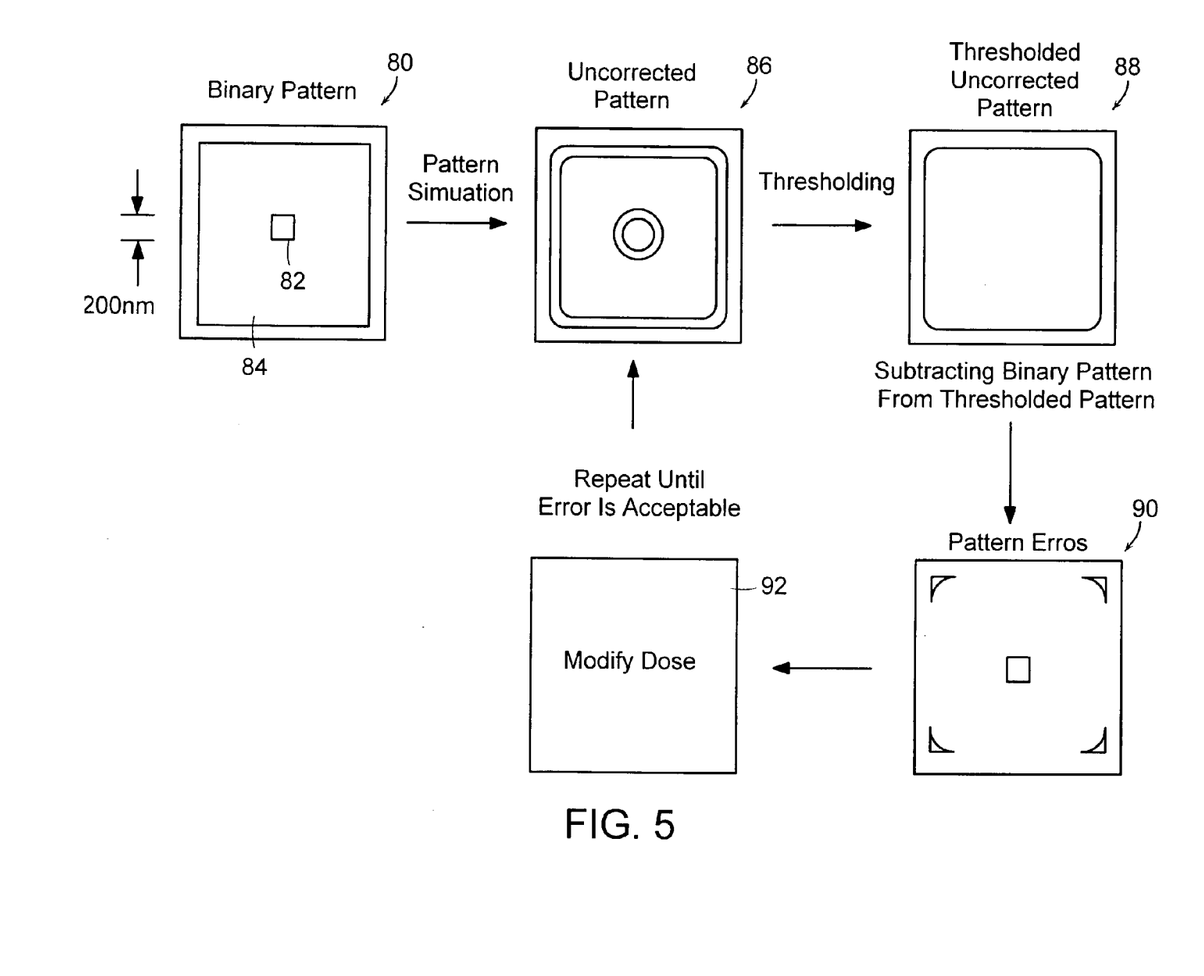
FIG. 5 shows an illustrative diagrammatic pictorial view of operational stages of a system in accordance with an embodiment of the invention.

FIG. 5 shows an illustrative diagrammatic pictoral view of images shown at different steps involved in the iterative-error-correction method discussed above. The binary pattern is the starting point for simulating the exposed pattern. The exposed pattern is thresholded to simulate the effect of the resist. The difference between the resulting pattern and the initial-binary pattern is the pattern error. Note that for a resist-threshold model, this error represents the pattern-placement error. This is used as the basis for modulating the exposure dose. In particular, the binary pattern shown at 80 consists of a single unexposed spot 82 in the center of an exposed square area 84. The size of the spot 82 may be as small as the size of the focused spot. The starting point assumes the same dose (=1) for all spots within the pattern and a dose of zero everywhere else. The uncorrected pattern is shown at 86. Note that with the initial dose distribution, the central spot is not resolved as shown at 88 by the thresholded-uncorrected pattern. A resist threshold at half the peak image intensity was assumed. The error pattern is shown at 90, and the modified dose is shown diagrammatically at 92. The simulations shown in the figure were performed using the PSF of a 0.7 numerical-aperture zone plate operating at $\lambda$=400 nm. The algorithm converged in about 10 iterations. Since, the search space is constrained to only those spots that cause an error, this algorithm converges very rapidly. Note that this algorithm automatically takes into account the discrete control of the exposure dose.

Figure 6A:
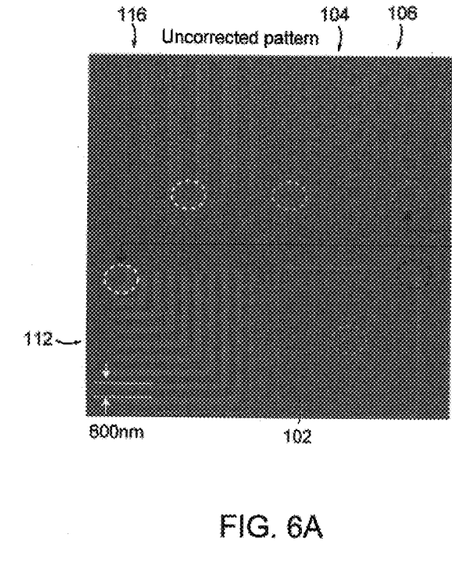
FIGS. 6A and 6B show illustrative photo-micrographic views of imaged patterns without and with error correction, respectively.
Figure 6B:
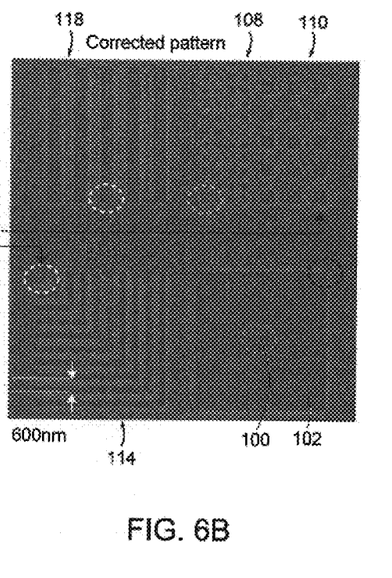

This algorithm was implemented in a computer simulation and tested in a zone-plate-array-lithography (ZPAL) system. First, a pattern was exposed with all the spots having the same dose. Then the iterative error-correction method was used to compensate the pattern for proximity effects by dose modulation. The dose modulation was achieved in practice by changing the exposure time of each spot. Scanning-electron micrographs of an original pattern were compared with scanning-electron micrographs of the corrected pattern as shown in FIGS. 6A and 6B respectively, where $\mu$=400 nm, zone-plate NA=0.7, and focal length=40 $\mu$m. A single unexposed spot 100 in the center of an exposed square 102 was only resolved after PEC. This is an example of a case where PEC improves the resolution of an isolated feature. The edges of squares are much sharper in the corrected version as shown at 108 and 110 than in the original pattern as shown at 104 and 106. In the uncorrected pattern 104, 106, the edges of the squares are very rounded such that the small squares look like circles. In a nested-L pattern, the smallest nested-L was much better defined with sharp edges in the corrected pattern as shown at 114 than in the original pattern as shown at 112. The rounding at edges of lines 116 was corrected by PEC to form square edges in the lines 118.

Techniques of the invention, therefore improve pattern fidelity of the printed pattern significantly in certain embodiments. The iterative-error-correction (IEC) algorithm may be combined with pattern parsing techniques that identify the regions that require optimization for efficient optimization of entire mask layouts. Since remote regions of a layout do not interact with one another, the IEC algorithm may be easily parallelized, i.e., the optimization of different regions may be performed by multiple processors simultaneously. This makes the computation significantly faster.

Since the IEC algorithm is independent of the resist-development model, different models may be inserted into the algorithm depending on the materials used. Tool constraints such as the diffraction-limited PSF and dose control are automatically incorporated into the dynamics of the optimization. This produces dramatic improvements in the printed pattern fidelity. Dose correction may also be done on several of the nearest neighbors depending on the control and accuracy required. There is a tradeoff between computational complexity and pattern-fidelity requirements.

The IEC algorithm may be applied to shaped beam systems as well by just replacing the point-spread function with the intensity profile of the shaped beam that forms a single exposure pixel. Finally, the IEC algorithm may also be extended to the case of partially coherent (projection) imaging. In this case, the image formation is a partially coherent process and hence, requires an appropriately modified computation. The smallest controllable feature on the photomask replaces the pixel described earlier. Since the dose may not be modified in the case of projection-imaging systems, the control variables may be the shapes and positions of features on the photomask and the phase of the smallest feature of a phase-shift mask, and the amplitude and phase of the smallest feature on an attenuated phase-shift mask. This is also referred to as optical-proximity correction (OPC). Currently, OPC is performed based on heuristic techniques or other model-based approaches. The advantages attributed to IEC algorithm in the case of incoherent imaging apply equally to the partially coherent case as well.

Those skilled in the art will appreciate that numerous modifications and variations may be made to the above disclosed embodiments without departing from the spirit and scope of the invention.

What is claimed is:

1. A system for providing error correction in an imaging system, said system comprising:
    error determination means for determining an amount of error associated with a spot at (x,y) in a binary pattern to be imaged;
    determination means for determining the location of a nearest exposed spot at ($x_i$, $y_i$) for each spot at (x,y); and
    dose modification means for modifying an exposure dose at the nearest exposed spot ($x_i$, $y_i$) for each spot at (x,y).

2. The system as claimed in claim 1, wherein said error determination means includes determining a convolution of the binary pattern to be imaged with a point-spread function.

3. The system as claimed in claim 1, wherein said error determination means includes determining an inverse fast-Fourier transform of a product of a fast-Fourier transform of the binary pattern and a fast-Fourier transform of a point spread function.

4. The system as claimed in claim 1, wherein said error determination means includes determining a thresholding pattern as a function of the exposed pattern.

5. The system as claimed in claim 1, wherein the amount of error associated with the spot (x,y) in the binary pattern to be imaged is provided as a difference between a thresholding pattern and the binary pattern.

6. The system as claimed in claim 1, wherein said system includes repetition means for iteratively determining the amount of error associated with a spot at (x,y) in the binary pattern to be imaged until the amount of error is not greater than an acceptable amount of error.

7. A system for providing error correction in a lithographic imaging system, said system comprising:
    exposed pattern simulation means for simulating an exposed pattern of a binary pattern to be imaged;
    thresholding means for determining a thresholding pattern by applying a thresholding function to the exposed pattern;
    error determination means for determining an amount of error associated with a spot at (x,y) in a binary pattern to be imaged corresponding to a difference between the thresholding pattern and the binary pattern;
    determination means for determining the location of a nearest exposed spot ($x_i$, $y_i$) for each spot (x,y); and
    dose modification means for modifying an exposure dose at the nearest exposed spot at ($x_i$,$y_i$) for each spot at (x,y).

8. The system as claimed in claim 7, wherein said exposed pattern simulation means includes determining a convolution of the binary pattern to be imaged with a point spread function.

9. The system as claimed in claim 7, wherein said exposed pattern simulation means includes determining an inverse fast-Fourier transform of a product of a fast-Fourier transform of the binary pattern and a fast-Fourier transform of a point spread function.

10. The system as claimed in claim 7, wherein said system includes repetition means for iteratively determining the amount of error associated with a spot at (x,y) in the binary pattern to be imaged until the amount of error is not greater than an acceptable amount of error.

11. A method of providing error correction in an imaging system, said method comprising the steps of:
    determining an amount of error associated with a spot at (x,y) in a binary pattern to be imaged;
    determining the location of a nearest exposed spot at ($x_i$, $y_i$) for each spot at (x,y); and
    modifying an exposure dose at the nearest exposed spot at ($x_i$, $y_i$) for each spot at (x,y).

12. The method as claimed in claim 11, wherein said step of determining an amount of error associated with a spot at (x,y) in a binary pattern to be imaged includes determining a convolution of the binary pattern to be imaged with a point spread function.

13. The method as claimed in claim 11, wherein said step of determining an amount of error associated with a spot (x,y) in a binary pattern to be imaged includes determining an inverse Fourier transform of a product of a Fourier transform of the binary pattern and a Fourier transform of a point spread function.

14. The method as claimed in claim 11, wherein said step of determining an amount of error associated with a spot at (x,y) in a binary pattern to be imaged includes determining a thresholding pattern as a function of the exposed pattern.

15. The method as claimed in claim 11, wherein the amount of error associated with the spot (x,y) in the binary pattern to be imaged is provided as a difference between a thresholding pattern and the binary pattern.

16. The method as claimed in claim 11, wherein said method further includes the step of iteratively returning to the step of determining the amount of error associated with a spot at (x,y) in the binary pattern to be imaged until the amount of error is not greater than an acceptable amount of error.

17. A method of providing error correction in a lithographic imaging system, said method comprising the steps of:
    simulating an exposed pattern of a binary pattern to be imaged;
    determining a thresholding pattern by applying a thresholding function to the exposed pattern;

determining an amount of error associated with a spot at (x,y) in a binary pattern to be imaged corresponding to a difference between the thresholding pattern and the binary pattern;

determining the location of a nearest exposed spot at $(x_i, y_i)$ for each spot at (x,y); and modifying an exposure dose at the nearest exposed spot at $(x_i, y_i)$ for each spot at (x,y).

18. The method as claimed in claim 17, wherein said step of simulating the exposed pattern of the binary pattern to be imaged includes determining a convolution of the binary pattern to be imaged with a point spread function.

19. The method as claimed in claim 17, wherein said step of simulating the exposed pattern of the binary pattern to be imaged includes determining an inverse Fourier transform of a product of a Fourier transform of the binary pattern and a Fourier transform of a point spread function.

20. The method as claimed in claim 17, wherein said method further includes the step of iteratively returning to the steps of determining a thresholding pattern by applying a thresholding function to the exposed pattern and determining the amount of error associated with a spot at (x,y) in the binary pattern to be imaged until the amount of error is not greater than an acceptable amount of error.

\* \* \* \* \*